(12) United States Patent
Lin

(10) Patent No.: US 8,405,977 B2
(45) Date of Patent: Mar. 26, 2013

(54) CONTAINER DATA CENTER

(75) Inventor: Tai-Wei Lin, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 227 days.

(21) Appl. No.: 13/076,459

(22) Filed: Mar. 31, 2011

(65) Prior Publication Data
US 2012/0168141 A1 Jul. 5, 2012

(30) Foreign Application Priority Data
Dec. 30, 2010 (TW) .............................. 99146780 A

(51) Int. Cl.
H05K 7/20 (2006.01)
(52) U.S. Cl. .............. 361/679.51; 361/679.49; 361/696; 454/184; 312/223.2
(58) Field of Classification Search ........................ None
See application file for complete search history.

(56) References Cited

U.S. PATENT DOCUMENTS

| | | | | |
|---|---|---|---|---|
| 6,034,873 | A * | 3/2000 | St.ang.hl et al. | 361/701 |
| 7,961,463 | B2 * | 6/2011 | Belady et al. | 361/695 |
| 8,300,402 | B2 * | 10/2012 | Wei | 361/679.47 |
| 8,320,128 | B2 * | 11/2012 | Wei | 361/695 |
| 2005/0168945 | A1 * | 8/2005 | Coglitore | 361/695 |
| 2008/0055846 | A1 * | 3/2008 | Clidaras et al. | 361/687 |
| 2012/0063082 | A1 * | 3/2012 | Chang et al. | 361/679.47 |

* cited by examiner

Primary Examiner — Courtney Smith
(74) Attorney, Agent, or Firm — Altis Law Group, Inc.

(57) ABSTRACT

A container data center includes a container, a group of server systems located in the container; a hot aisle and a cold aisle formed at two opposite sides of one group of server systems, a fan apparatus located at a top of the hot aisle, a heat exchanger located adjacent to the fan apparatus and opposite to the hot aisle; a cold airflow buffering area formed at a top of the cold aisle, and blades located below the cold airflow buffering area. Fan apparatus draws in hot airflow from hot aisle into the heat exchanger. The heat exchanger transforms the hot airflow into cold airflow and exhausts the cold airflow into the cold aisle through the cold airflow buffering area and the blades. Swinging angles of the blades are adjusted according to wind speeds of the cold airflow through the blades to obtain a uniform flow.

10 Claims, 5 Drawing Sheets

CONTAINER DATA CENTER

BACKGROUND

1. Technical Field

The present disclosure relates to data centers, and particularly to a container data center.

2. Description of Related Art

With increasing heavy duty use of on-line applications, the need for computer data centers has increased rapidly. Data centers are centralized computing facilities that include many servers, often arranged on server racks or shelves. In a common data center, cold airflow is provided to a cold aisle of the data center through an opening defined in a top of the data center.

However, the cold airflow may become disorderly or turbulent in the data center. Therefore, some server systems may not be sufficiently cooled, but other server systems may be excessively cooled.

What is needed, therefore, is a container data center which can overcome the above problem.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
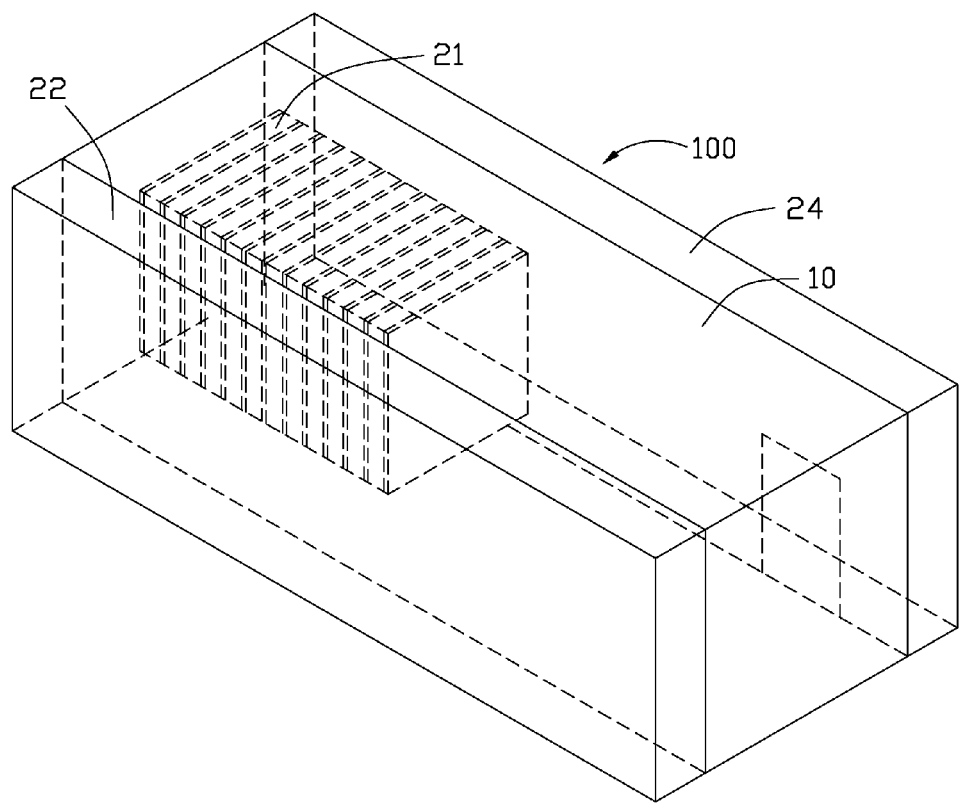
FIG. 1 is an isometric, schematic view of a container data center in accordance with a first embodiment of the disclosure, wherein the container data center comprises a cold aisle.
Figure 2:
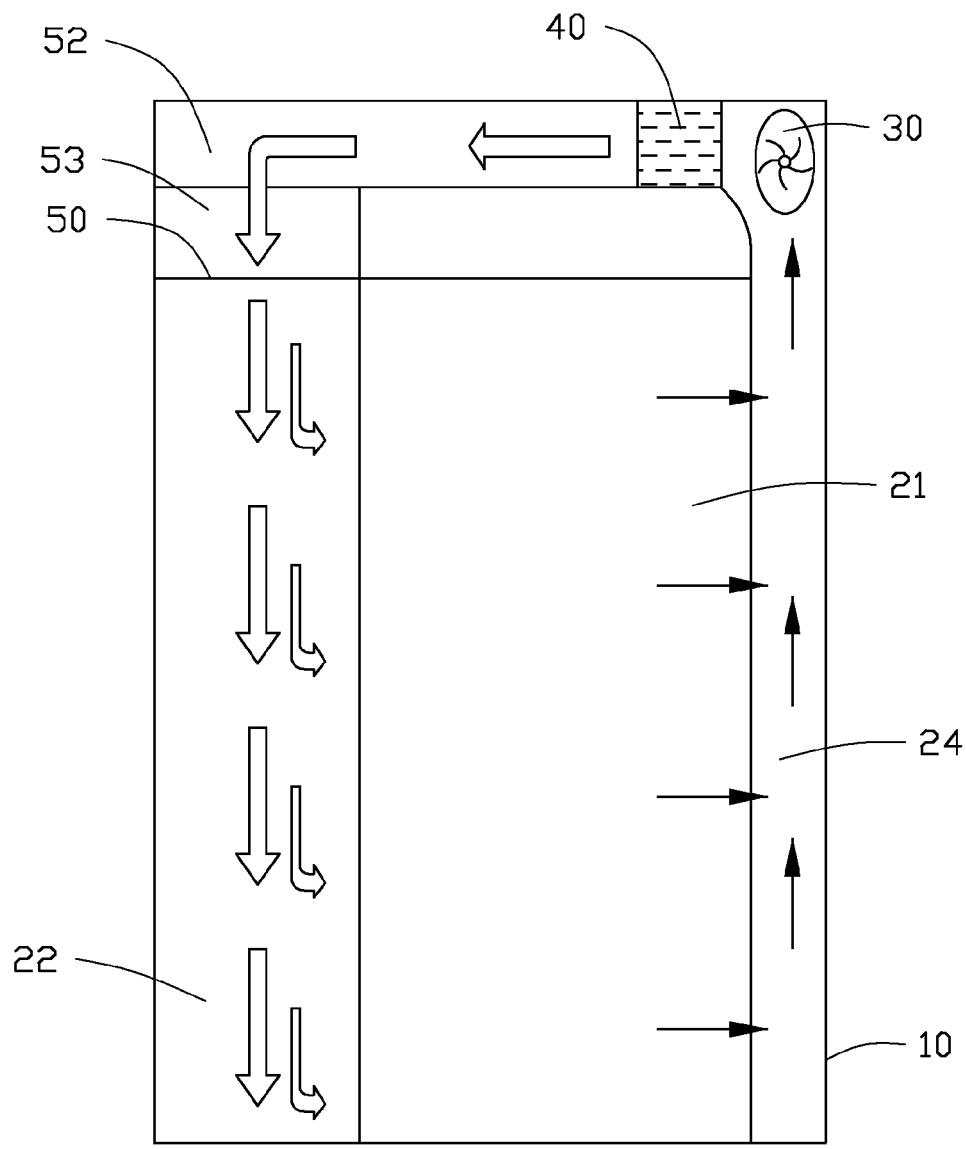
FIG. 2 is another schematic view of the container data center of FIG. 1 as viewed in a lateral direction.

Referring to FIGS. 1-2, a container data center 100 in accordance with a first embodiment is illustrated. The container data center 100 comprises a container 10 and a group of server systems 21 installed in the container 10, a cold aisle 22 and a hot aisle 24 formed in the container. The cold aisle 22 and the hot aisle 24 are located at two opposite sides of the container 10, respectively. The server systems 21 are located between the cold aisle 22 and the hot aisle 24. In this embodiment, the container 10 is movable.

The container data center 100 further comprises a fan apparatus 30, a heat exchanger 40, and a wind-guiding device 50. The fan apparatus 30, the heat exchanger 40, and the wind-guiding device 50 are mounted on the top of the container 10. The fan apparatus 30 is located at a top of the hot aisle 24. The heat exchanger 40 is located adjacent to the fan apparatus 30 and opposite to the hot aisle 24. The wind-guiding device 50 is located at a top of the cold aisle 22. A cold airflow collecting area 52 and a cold airflow buffering area 53 are formed between the heat exchanger 40 and the wind-guiding device 50.

The fan apparatus 30 draws hot airflow (a plurality of small solid arrows identified as the small black arrows stand for hot airflow in FIG. 2) in the hot aisle 24 into the heat exchangers 40. The heat exchanger 40 transforms the hot airflow into cold airflow (a plurality of large hollow arrows identified as the outlined white arrows stand for or represent cold airflow in FIG. 2) and exhausts the cold airflow into the cold airflow collecting area 52. The cold airflow in the cold airflow collecting area 52 flows into the cold airflow buffering area 53 and then flows into the cold aisle 22 through the wind-guiding device 50. The cold airflow in the cold aisle 22 dissipates heat for the server systems 21.

Figure 3:
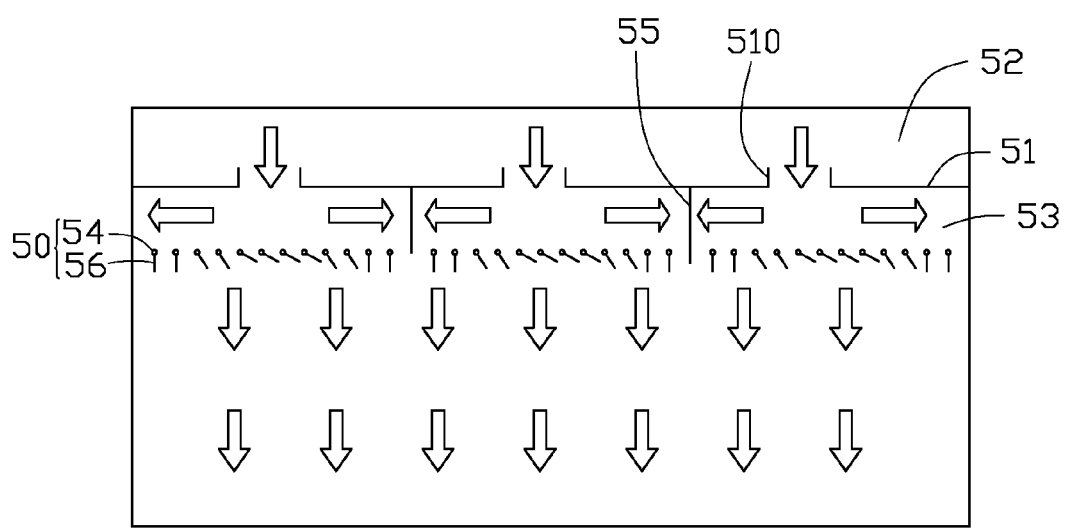
FIG. 3 is a schematic view of the cold aisle of the container data center of FIG. 1 in a longitudinal direction.

Referring also to FIG. 3, a wind-guiding member 51 is disposed between the cold airflow collecting area 52 and the cold airflow buffering area 53. The wind-guiding member 51 evenly defines three air intakes 510 therein. The air intakes 510 are spaced from each other. The cold airflow buffering area 53 is evenly separated into three sections by two partitions 55. Each section of the cold airflow buffering area 53 has a central part thereof corresponding to a corresponding air intake 510. In this embodiment, the wind-guiding member 51 is a flat board parallel to a top wall of the container 10.

The wind-guiding device 50 comprises a plurality of pivots 54, a plurality of blades 56 respectively connected with the pivots 54, and a plurality of elastic traction elements (not shown) respectively connected to the blades 56. Each pivot 54 has two opposite ends thereof horizontally mounted on two opposite sides of the cold aisle 22, respectively. Each blade 56 has an end thereof engaged pivotally to a corresponding pivot 54, and an opposite end of the blade 56 is a free end. The blades 56 are separated into three groups corresponding to three sections of the cold airflow buffering area 53. The blades 56 are configured in a common plane and cover the cold airflow buffering area 53 when the blades 56 are not being used. In this embodiment, the blades 56 are configured in a horizontal state when the blades 56 are not being used.

Due to the air intake 510 disposed in a location corresponding to the central part of one section of the cold airflow buffering area 53, a flow velocity of the cold airflow gradually decreases from the central part to two opposite sides of the section of the cold airflow buffering area 53. According to Bernoulli Equation, pressures generated by the cold airflow on the blades 56 gradually increase from the central part to the opposite sides of the section. Accordingly, a plurality of swinging angles of the blades 56 gradually increase from the central part to the opposite sides of the section. As a result, a uniform flow is formed in each section of the cold airflow buffering area 53.

When the blades 56 are operating or being used, the elastic traction elements having suitable spring forces draw the blades 56 backwardly, thereby preventing the blades 56 from being over-rotated by the cold airflow. The elastic traction elements draw the blades 56 back to the original state when there is no airflow through the wind-guiding device 50.

Figure 4:
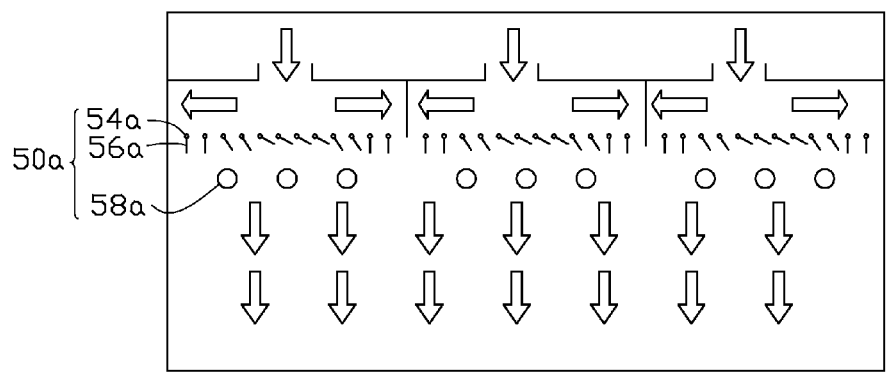
FIG. 4 is similar to FIG. 3, but with a wind-guiding device thereof which is different from that shown in FIG. 3.

In another embodiment, a wind-guiding device 50a, as shown in FIG. 4, may be provided to replace the wind-guiding device 50 of the previous embodiment. The wind-guiding device 50a comprises a plurality of blades 56a mounted in the cold aisle 22 via a plurality of pivots 54a and a plurality of speed sensors 58a located below the blades 56a. In this embodiment, each blade 56a has an end thereof engaged pivotally to a corresponding pivot 54a, and an opposite end of the blade 56 is a free end. The speed sensors 58a are evenly spaced from each other.

The speed sensor 58a detects the wind speeds below the blades 56a and outputs the wind speed data to controllers (not shown). The controllers send one or more control signals to one or more drivers for driving the blades 56a, thereby controlling the swinging angles of the blades 56a. When the wind speeds below the blades 56a become larger, the swinging angles of the blades 56a become smaller. When the wind speeds below the blades 56a become smaller, the swinging angles of the blades 56a become larger, whereby a uniform flow is formed through the wind-guiding device 50a. The drivers for driving the blades 56a may be step motors.

Figure 5:
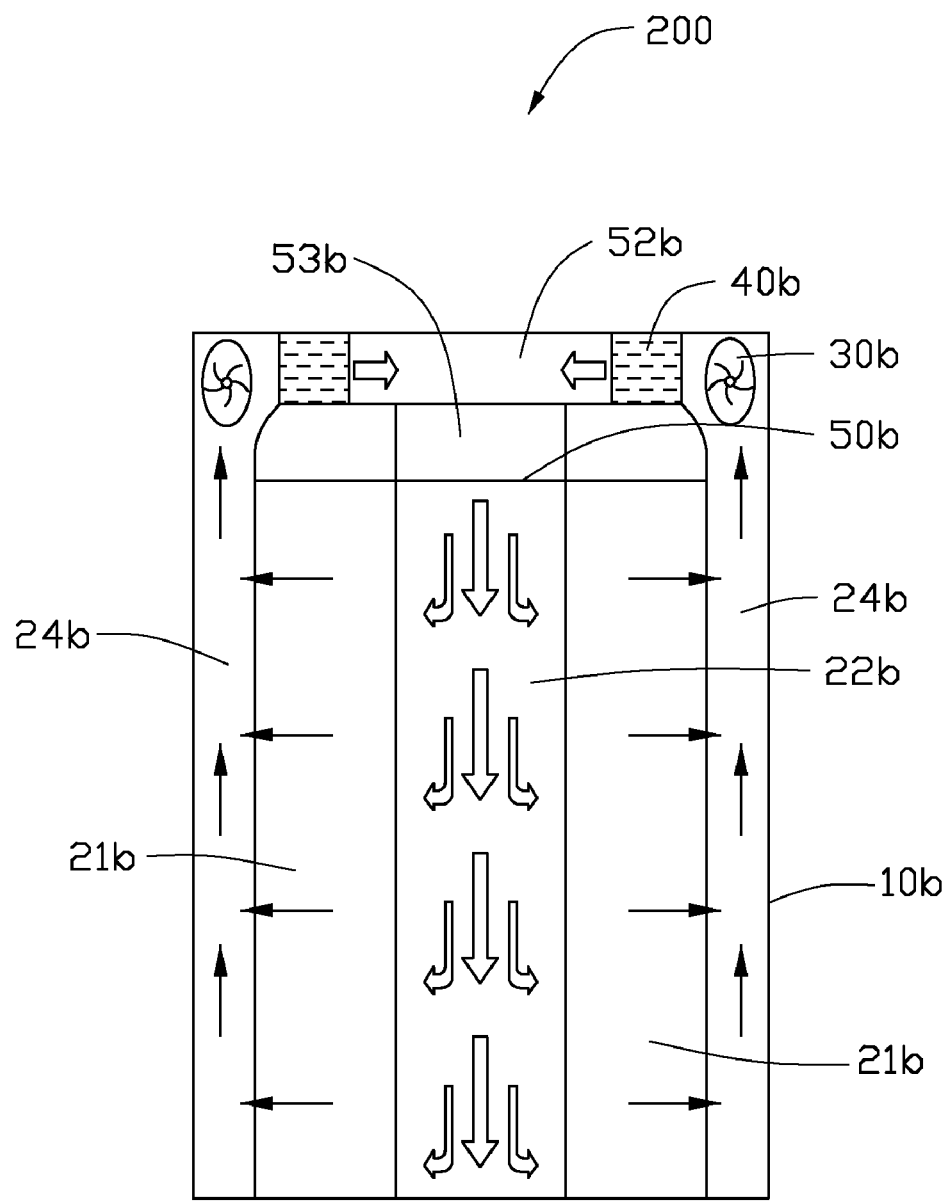
FIG. 5 is a schematic view of a container data center in accordance with a second embodiment of the disclosure.

Referring to FIG. 5, a container data center 200 in accordance with a second embodiment similar to the container data center 100 in the first embodiment is shown. The main differences between the container data centers 100, 200 are that, for the second embodiment, two groups of server systems 21b are located in a container 10b, a cold aisle 22b is formed between the two groups of server systems 21b, two hot aisles 24b are formed at two opposite sides of the server systems 21b, two fan apparatuses 30b respectively are located at the top of the hot aisles 24b, and two heat exchangers 40b respectively are adjacent to the fan apparatuses 30b. The heat exchangers 40b are located between the fan apparatuses 30b.

The fan apparatuses 30b configured to draw in hot airflow from the hot aisles 24b into the heat exchangers 40b. The heat exchangers 40b transform the hot airflow into cold airflow and exhaust the cold airflow into the cold airflow collecting area 52b. The cold airflow further flows into the cold airflow buffering area 53b and then flows into the cold aisle 22b through the wind-guiding device 50b.

In the first and second embodiments, the wind speed in the cold aisles 22, 22b is controlled at about 0.3 m/s so that the workers in the containers 10, 10b feel comfortable.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A container data center comprising:
    a container;
    one or more groups of server systems located in the container;
    a hot aisle and a cold aisle formed at two opposite sides of the group of server systems, respectively;
    a fan apparatus located at a top of the hot aisle;
    a heat exchanger located adjacent to the fan apparatus and opposite to the hot aisle;
    a cold airflow buffering area formed at a top of the cold aisle; and
    a plurality of blades located below the cold airflow buffering area;
    wherein the fan apparatus is configured to draw in hot airflow from the hot aisle into the heat exchanger, the heat exchanger transforming the hot airflow into cold airflow and exhausting the cold airflow into the cold aisle through the cold airflow buffering area and the blades, and a plurality of swinging angles of the blades being adjusted according to the wind speeds of the cold airflow through the blades to obtain a uniform flow.

2. The container data center of claim 1 further comprising a plurality of pivots, wherein each pivot has two opposite ends thereof horizontally mounted on two opposite sides of the cold aisle, respectively, each blade having an end thereof engaged pivotally to one corresponding pivot.

3. The container data center of claim 2, wherein the swinging angles of the blades are adjusted according to Bernoulli Equation.

4. The container data center of claim 3, wherein the blades are rebounded back to an original state when there is no airflow through the blades.

5. The container data center of claim 1 further comprising a wind-guiding member, wherein the wind-guiding member is disposed between the cold airflow collecting area and the cold airflow buffering area, and the cold airflow buffering area is formed between the blades and the wind-guiding member.

6. The container data center of claim 5, wherein the wind-guiding member substantially evenly defines a plurality of air intakes therein, the cold airflow buffering area is separated by a plurality of partitions and dividing into a plurality of sections, each of the sections has a central part thereof corresponding to one corresponding air intake.

7. The container data center of claim 6, wherein the swinging angles of the blades gradually increase from the central part to two opposite sides of each section of the cold airflow buffering area.

8. The container data center of claim 1 further comprising a plurality of speed sensors, a plurality of controllers, and a plurality of drivers, wherein the speed sensors detect the wind speeds below the blades and output the wind speed data to the controllers, the controllers sending one or more control signals to the drivers, thereby controlling the swinging angles of the blades.

9. The container data center of claim 1, wherein the wind speed in the cold aisle is controlled at about 0.3 m/s.

10. The container data center of claim 2, wherein the blades cover the cold airflow buffering area and are configured in a common plane when the blades are not being used.

* * * * *